US005647915A

United States Patent [19]
Zukerman

[11] Patent Number: 5,647,915
[45] Date of Patent: Jul. 15, 1997

[54] SOLAR ENERGY PANEL

[76] Inventor: Charles Zukerman, 806 Cypress Grove La., Apt. #102, Pompano Beach, Fla. 33060

[21] Appl. No.: 663,512

[22] Filed: Jun. 13, 1996

[51] Int. Cl.$^6$ ............... E04D 13/18; H01L 31/048
[52] U.S. Cl. ............... 136/251; 52/173.3; 136/291
[58] Field of Search ................ 136/251, 291; 52/173.3

[56] References Cited

U.S. PATENT DOCUMENTS

| | | | |
|---|---|---|---|
| 4,038,967 | 8/1977 | Stout et al. | 126/679 |
| 4,189,881 | 2/1980 | Hawley | 52/91.3 |
| 4,204,523 | 5/1980 | Rothe | 126/623 |
| 4,233,085 | 11/1980 | Roderick et al. | 136/244 |
| 4,392,483 | 7/1983 | Koenig | 128/650 |
| 4,393,859 | 7/1983 | Marossy et al. | 126/586 |
| 4,416,265 | 11/1983 | Wallace | 126/660 |
| 4,418,685 | 12/1983 | Frazier | 126/628 |
| 4,526,161 | 7/1985 | Kaicher | 126/668 |
| 4,526,162 | 7/1985 | Arai | 126/709 |
| 4,611,090 | 9/1986 | Catella et al. | 136/251 |
| 4,677,248 | 6/1987 | Lacey | 136/244 |
| 4,712,338 | 12/1987 | Trickel | 52/90.2 |
| 4,936,063 | 6/1990 | Humphrey | 52/200 |
| 5,036,833 | 8/1991 | Quigley et al. | 126/621 |
| 5,092,939 | 3/1992 | Nath et al. | 136/251 |
| 5,164,020 | 11/1992 | Wagner et al. | 136/251 |
| 5,232,518 | 8/1993 | Nath et al. | 136/251 |
| 5,252,141 | 10/1993 | Inoue et al. | 136/251 |
| 5,259,363 | 11/1993 | Peacock et al. | 126/621 |
| 5,289,999 | 3/1994 | Naujeck et al. | 244/173 |
| 5,338,369 | 8/1994 | Rawlings | 136/246 |
| 5,367,843 | 11/1994 | Hirai et al. | 52/200 |
| 5,406,936 | 4/1995 | Hirai et al. | 126/623 |
| 5,409,549 | 4/1995 | Mori | 136/244 |
| 5,480,494 | 1/1996 | Inoue | 136/251 |
| 5,497,587 | 3/1996 | Hirai et al. | 52/173.3 |
| 5,505,788 | 4/1996 | Dinwoodie | 136/246 |
| 5,509,973 | 4/1996 | Ishikawa et al. | 136/251 |
| 5,524,401 | 6/1996 | Ishikawa et al. | 52/173.3 |
| 5,542,989 | 8/1996 | Ichikawa | 136/251 |

FOREIGN PATENT DOCUMENTS

| | | | |
|---|---|---|---|
| 61-287278 | 12/1986 | Japan | 136/251 |
| 6-85302 | 3/1994 | Japan | 136/251 |

*Primary Examiner*—Aaron Weisstuch
*Attorney, Agent, or Firm*—Graham & James LLP

[57] ABSTRACT

A combined solar energy panel and roof element, which provides an additional layer of weather proofing to a building, as well as providing an electric power source. The solar energy panel is comprised of a translucent polymeric pane, with electrically interconnected photovoltaic cells laminated onto the underside of the polymeric pane. A polymeric frame is attached to the underside of the pane contiguous to the edges of the pane. Anchor blocks are adhered to the roof and the panel is attached to the roof at the anchor blocks, where several anchor blocks support the frame attached to the panel and each anchor block may support the frames of more than one panel. A plurality of solar energy panels may be arranged in an array, whereby waterproofing means seals any spaces between the panels.

9 Claims, 3 Drawing Sheets

SOLAR ENERGY PANEL

BACKGROUND OF THE INVENTION

1. Technical Field

The present invention relates to solar energy panels, specifically solar energy panels capable of being mounted on building roofs for providing electric power.

2. Background Information

Solar energy panels for the conversion of sunlight into electricity are well known as a mostly pollution free source of energy. Existing solar energy panels are constructed with photovoltaic material, which converts sunlight into electricity, often configured as discrete cells of a thin wafer construction. The cells are wired together to provide the electricity in useful amounts, which electricity is output to a common electrical connection. These cells are relatively fragile and require protection when used outdoors. Current solar energy panels protect the photovoltaic cells with a glass pane supported by a metal frame. In such configurations, the thin photovoltaic cells are often adhered or laminated to the glass pane.

Framing has been used as a means of providing support or stability to solar energy panels. Prior art framing consists of separate elements of metal, wood, Plexiglass® or other plastic, used to support the solar energy panel with flanges around the edges of the pane or other forms which cover or overlap the edges of the pane.

Existing panels are both heavy and relatively fragile, with most of the weight of such panels derived from the metal framing and the glass pane. With heavy panels, the additional weight added to a roof is a major consideration in construction and installation. Existing panels have been affixed directly to the roof rafters in an attempt to provide proper support for the weight of the panels.

Solar energy panels must cover a large surface area in order to produce a significant amount of electricity, since panels with small surface areas provide no more than a minimal amount of electricity. Although a large panel could provide a primary source of electricity, because of concerns about cost and weight of the glass pane and supporting frame, existing photovoltaic panels have not been constructed to cover large areas. Therefore, such existing panels are usually configured to provide only a supplement to the generator-produced electricity provided by a conventional utility company.

To limit obstacles between solar energy panels and the sun, solar energy panels are often mounted on the roofs of buildings. Roof mounting has the benefit of providing some clearance from shade cast by surrounding buildings and trees. However, roof mounted solar panels, like all outdoor construction, present concerns about weather conditioning. Water has a known deleterious effect on electrical systems and may damage the photovoltaic material. It is desired for roof mounted solar panels to be large in order to minimize the number of seams in which water may enter, although the size of the panels is limited by concerns such as cost and strength of the glass pane, as well as the weight of large panels and their support framing. It is therefore desired to have a solar energy panel which is weather proofed to limit or reduce the potential for water damage.

Prior roof-mounted solar panels have been concerned with whether the roof can provide sufficient support for the heavy metal frames and glass panes. For large panes, the weight of the frame introduces the problem of excess weight on a building's roof. It is therefore desired to have a lightweight frame which supports the solar panel. Further, it is desired to remove the need for, and associated complications involved in, additional framing in solar energy panel construction.

Because of their limited energy production efficiency, and in order to be a cost-efficient device, it is desired that solar energy panels be cheap and durable. It is also desired that the panels be easy to replace in the event of damage to an individual panel. Modular construction is desired whereby an individual panel can be installed or replaced with ease. Reducing the amount of framing serves the goals of ease of construction and ease of replacement.

The cost of existing panels requires a significant investment of money for installation, as well as resulting in an increased cost of maintenance and replacement. Such high costs prevent widespread use of solar energy. Further, because of the current state of solar energy technology, cost effective use of solar energy panels is primarily found in warmer, sunnier latitudes or in areas where conventional electric power is unusually costly. With cheaper solar energy panels, the benefits of solar energy technology may be realized in cooler climate zones and in locales where conventional electricity is common.

The present invention provides features which overcome the limitations and problems of previous solar energy panels.

It is an object of the present invention to provide a solar energy panel which may be used to cover an entire roof without overloading the roof's ability to support the additional weight of the solar energy panel.

It is a further object of the present invention to provide a solar energy panel for which additional weighty framing is unnecessary.

It is another object of the present invention to provide a relatively inexpensive solar energy panel and roofing element which may be easily mounted onto an existing roof.

SUMMARY OF THE INVENTION

The present invention provides a combined solar energy panel and roof element, where the combined solar energy panel and roof element provides an additional layer of weather proofing, as well as providing a source of electric power. The solar energy panel is comprised of a polymeric pane of Plexiglass® or other plastic, with photovoltaic cells attached to the underside of the polymeric pane. The photovoltaic cells of the panel are electrically interconnected and a plastic lamination covers the underside of the cells on the pane. A polymeric support frame is attached at the edges of the pane and may also provide support to the underside of the center of the pane. Anchor blocks are adhered to the roof and the panel is attached to the roof at the anchor blocks, where several anchor blocks support the frame of the panel and each anchor block may support the frames of more than one panel. Seams between panels are sealed with a weatherproofing flashing material.

DETAILED DESCRIPTION OF THE PREFERRED EMBODIMENTS

Figure 1:
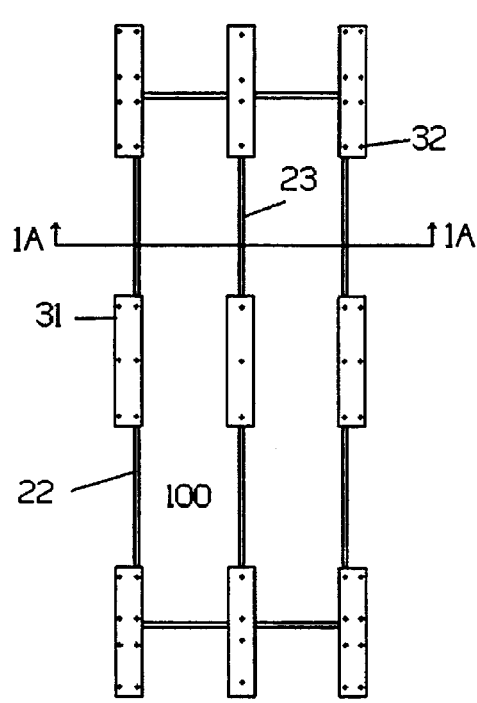
FIG. 1 is a view of the underside of one panel of the present invention.

As seen in the attached figures, the solar energy panel 100 is composed of a polymeric pane 20. Pane 20 is comprised of a polymeric material such as Plexiglass® or other plastic, and is preferably completely transparent to sunlight. Translucent or less than completely transparent panes can also be used, although the efficiency of the panel may be diminished. A transparent pane allows the maximum amount of solar energy through the pane to photovoltaic cells 21, which are preferably laminated to the underside of pane 20. Beneath photovoltaic cells 21 may be plastic lamination 25 which provides protection for the photovoltaic cells 21.

Frame 22 is attached at the edges of pane 20. Support framing leg 23 crosses under a length of pane 20 for additional support. Both frame 22 and support framing leg 23 are composed of a polymeric material and extend as a ridge below pane 20.

Frame 22 is comprised of at least one support element. Where frame 22 is comprised of more than one support element, the individual support elements may be elongated members running along the edges of pane 20. Preferably, frame 22 is attached proximate to the edges of pane 20 and continues along the edges, forming an open box when pane 20 is rectangular in shape. Support framing leg 23 is preferably attached along the center of the underside of the pane. Both frame 22 and support framing leg 23 may be attached to pane 20, or to lamination 25.

Figure 5B:
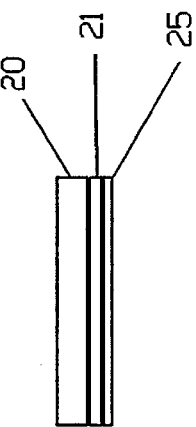
FIG. 5B is a cross-sectional view of the panel of the present invention, as seen along line 5B—5B of FIG. 4.
Figure 5A:
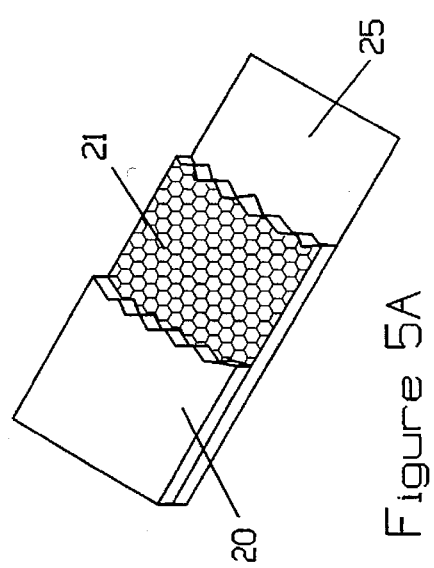
FIG. 5A is a exploded view of part of the panel of the present invention, showing multiple layers of the panel.

Photovoltaic cells 21 may be in any configuration. A common configuration is shown in area A of FIG. 2 and in FIG. 5A, where the photovoltaic cells 21 are shown as hexagons, placed in an adjacent fashion and are electrically interconnected to provide a common electrical connection as is known in the art. The common electrical connection to the interconnected photovoltaic cells 21 of a given panel, not shown, may be connected to other solar energy panels, for example panels 200, 300, 400, 500 or 600, or to an external receptor, also not shown.

Figure 2:
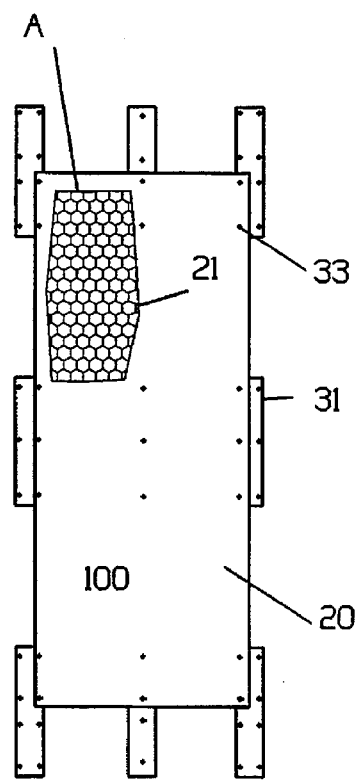
FIG. 2 is an elevated view of one panel of the present invention, showing cutaway section A, which reveals the photovoltaic cells as they appear in the panel.
Figure 1A:
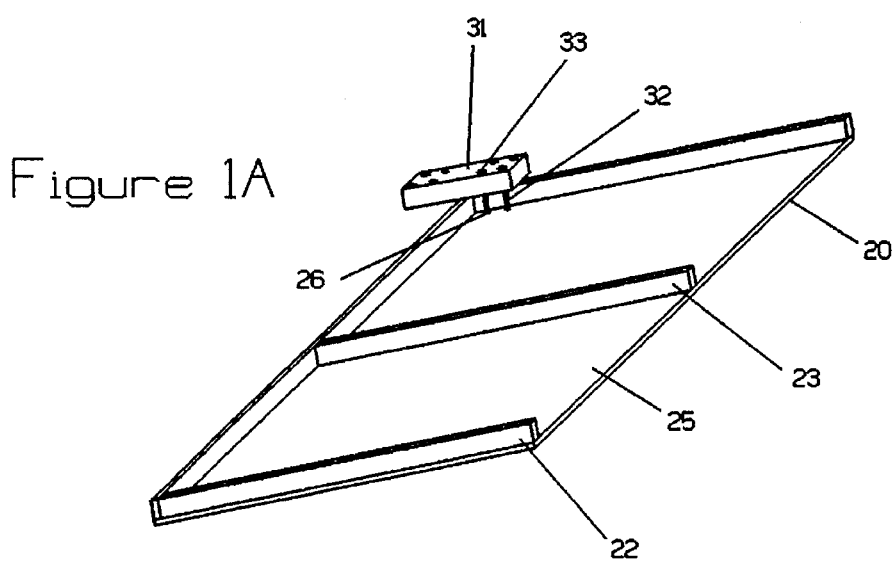
FIG. 1A is an isometric view of part of one panel of the present invention with one anchor block attached, cut away at line 1A—1A of FIG. 1.

Anchor block 31 is attached to roof 10 by a special industrial adhesive 39, which is known to those skilled in the art. Anchor block 31 may be composed of a polymer such as Plexiglass® or other plastic, or another structurally supportive material. Bolts 32 protrude through anchor block 31 and through holes 26 in pane 20, and are secured by nuts 33, which are shown in FIG. 4 as cap nuts. For additional weatherproofing, washer 35 may be placed between nut 33 and pane 20. For additional support, additional anchor blocks 31 may be located in the middle of pane 20, as shown in FIGS. 2 and 3.

Figure 3:
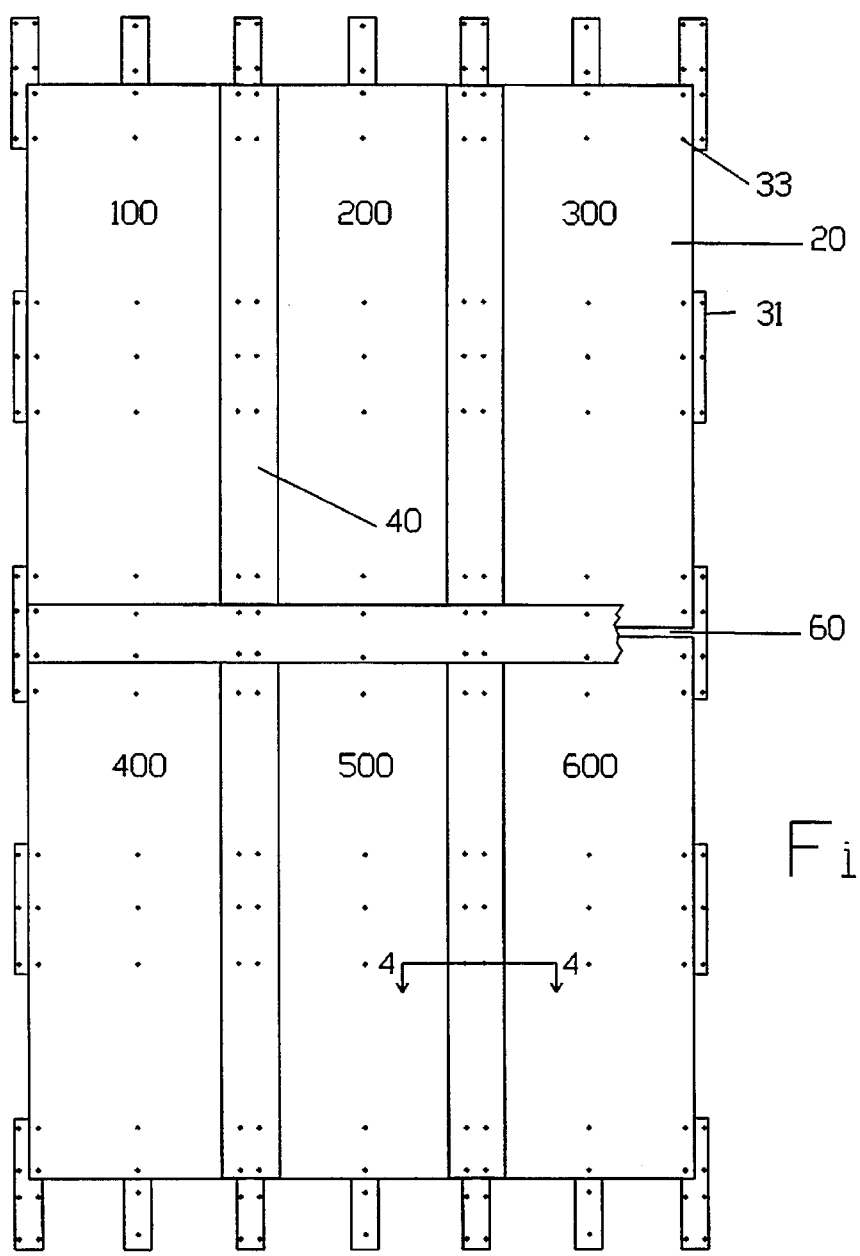
FIG. 3 is an elevated view of an array of panels of the present invention, showing a cutaway of the flashing material and revealing the separation between adjacent panels.
Figure 4:
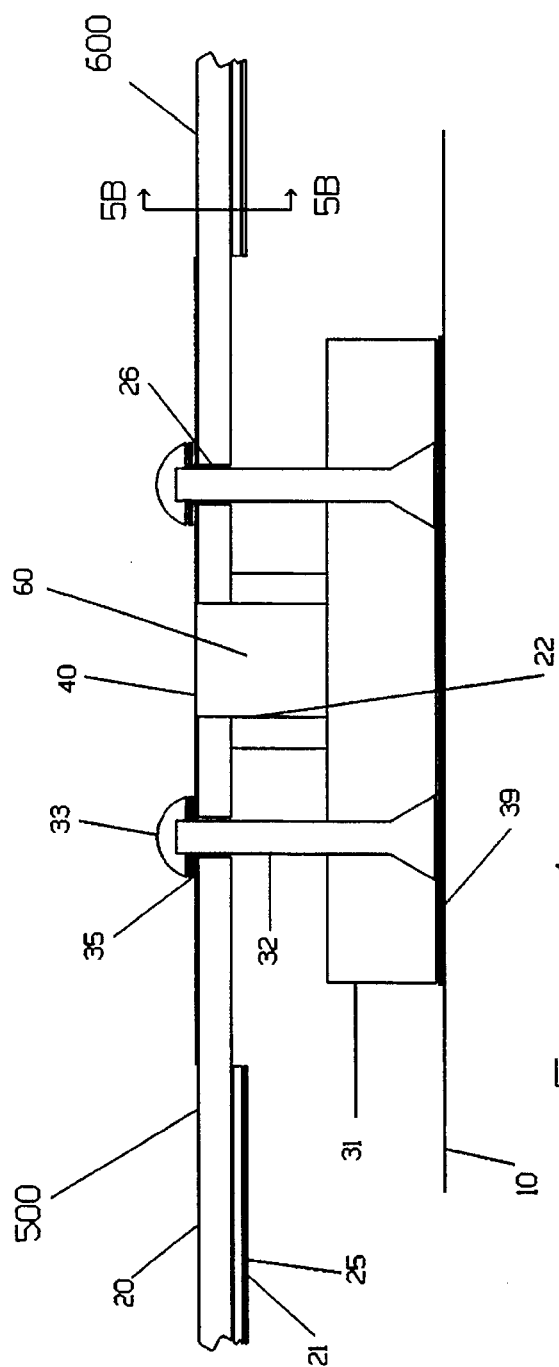
FIG. 4 is a cross-sectional view of the present invention, as seen along line 4—4 of FIG. 3.

Multiple panels may be attached to the anchor blocks, as shown in FIG. 3, where a space 60 is provided between adjacent panels to allow for expansion and contraction of the panels.

Weatherproofing flashing material 40 is placed over pane 20 overlapping the edge of the panel. Where multiple panels are attached adjacently to the anchor blocks, as shown in FIGS. 3 and 4, the weatherproofing flashing material 40 covers space 60 and prevents water from entering space 60.

The flashing material may be strips of roofing material cut to approximately 6 inches wide.

While certain novel features of this invention have been shown and described and are pointed out in the annexed claims, it will be understood that various omissions, substitutions and changes in the forms and details of the device illustrated and in its operation can be made by those skilled in the art without departing from the spirit of the invention.

I claim:

1. A combined solar energy panel and roofing element, adapted to be mounted on a roof of a building, comprising:

(a) a polymeric sheet which is at least partially transparent to light, having top and bottom surfaces and a plurality of edges, wherein electrically interconnected photovoltaic cells are provided at the bottom surface of the sheet;

(b) at least one support element attached to the bottom surface of the sheet and extending downwardly therefrom, said at least one support element attached proximate to and contiguous with the edges of the sheet;

(c) a plurality of anchor blocks adapted to be attached to the roof; and (d) a plurality of connectors connecting the sheet to the plurality of anchor blocks, such that said at least one support element rests upon at least one block.

2. The combined solar energy panel and roofing element of claim 1, further comprising means for waterproofing the sheet and the connectors.

3. The combined solar energy panel and roofing element of claim 2, where the waterproofing means comprises waterproof flashing material.

4. The combined solar energy panel and roofing element of claim 1, where the anchor blocks are adapted to be attached to the roof by an adhesive.

5. The combined solar energy panel and roofing element of claim 1, where the connectors comprise a plurality of bolts, with a first end secured within an anchor block and a second end protruding from the anchor block and passing through the sheet; and a plurality of nuts, each attached at the second end of one of the bolts.

6. The combined solar energy panel and roofing element of claim 1, further comprising a layer of polymeric material covering the exposed surfaces of the photovoltaic cells.

7. A solar energy panel for conversion of sunlight into electricity, said conversion implemented by a plurality of electrically interconnected photovoltaic cells in a flat array, wherein the solar energy panel further comprises:

a translucent polymeric sheet, with top and bottom surfaces and a plurality of edges, wherein the array of photovoltaic cells is attached to the bottom surface of the sheet; anchor blocks adapted for attaching the panel to an underlying surface;

at least one support element attached to the bottom surface of the sheet and extending downwardly therefrom toward, and connected to, the anchor blocks, said at least one support element proximate the edges of the sheet and contiguous thereto; and polymeric lamination sealing the photovoltaic cells to the bottom surface of the polymeric sheet.

8. The solar energy panel of claim 7, further comprising means for waterproofing the sheet and said at least one support element.

9. An array comprised of a plurality of combined solar energy panel and roofing elements, said array adapted to be mounted on a roof of a building, said array further comprising:

a plurality of said solar energy panels, wherein each solar energy panel comprises a polymeric sheet which is at least partially transparent to light, having top and bottom surfaces and a plurality of edges, wherein electrically interconnected photovoltaic cells are laminated to the bottom surface of the sheet;

at least one support element attached to the bottom surface of the sheet and extending downwardly therefrom, said at least one support element attached proximate to and contiguous with the edges of the sheet;

a plurality of anchor blocks adapted to be attached to the roof; connectors for connecting each said solar energy panel to one or more anchor blocks, where said at least one support element of the solar energy panel rests upon at least one anchor block; and means for waterproofing the solar energy panels and the connectors, wherein the waterproofing means is adapted to seal adjacent solar energy panels in the array and their respective connectors.

* * * * *